(12) United States Patent
Shi et al.

(10) Patent No.: US 12,267,660 B2
(45) Date of Patent: Apr. 1, 2025

(54) SPEAKER

(71) Applicant: AAC Microtech (Changzhou) Co., Ltd., Changzhou (CN)

(72) Inventors: Yang Shi, Shenzhen (CN); Shuwen Wu, Shenzhen (CN)

(73) Assignee: AAC Microtech (Changzhou) Co., Ltd., Changzhou (CN)

(*) Notice: Subject to any disclaimer, the term of this patent is extended or adjusted under 35 U.S.C. 154(b) by 224 days.

(21) Appl. No.: 18/090,460

(22) Filed: Dec. 28, 2022

(65) Prior Publication Data

US 2024/0056742 A1    Feb. 15, 2024

Related U.S. Application Data

(63) Continuation of application No. PCT/CN2022/125113, filed on Oct. 13, 2022.

(30) Foreign Application Priority Data

Aug. 12, 2022    (CN) .......................... 202222130364.4

(51) Int. Cl.
```
H04R 7/12      (2006.01)
H04R 7/06      (2006.01)
H04R 9/02      (2006.01)
H04R 9/04      (2006.01)
H04R 9/06      (2006.01)
H05K 1/18      (2006.01)
```

(52) U.S. Cl.
CPC ............... *H04R 9/046* (2013.01); *H04R 7/12* (2013.01); *H04R 9/027* (2013.01); *H04R 9/06* (2013.01); *H05K 1/189* (2013.01); *H04R 2499/11* (2013.01)

(58) Field of Classification Search
CPC .......... H04R 9/046; H04R 7/12; H04R 9/027; H04R 9/06
See application file for complete search history.

(56) References Cited

U.S. PATENT DOCUMENTS

| | | | | |
|---|---|---|---|---|
| 11,805,369 B2* | 10/2023 | Xiao | ....................... | H04R 31/00 |
| 12,041,435 B2* | 7/2024 | Xiao | ....................... | H04R 9/025 |
| 2023/0239629 A1* | 7/2023 | Xiao | ....................... | H04R 9/027 |

* cited by examiner

*Primary Examiner* — Suhan Ni
(74) *Attorney, Agent, or Firm* — W&G Law Group

(57) ABSTRACT

A speaker includes: a frame, a vibration system, including a diaphragm, a voice coil, and a flexible circuit board, the flexible circuit board including a first fixing portion, a second fixing portion, and an elastic arm, and a magnetic circuit system, including a yoke with a through hole and a main magnet and a secondary magnet fixed to the yoke, the secondary magnet surrounding and spaced from the main magnet for forming a magnetic gap, the voice coil located in the magnetic gap, wherein a projection of the elastic arm along a vibration direction of the diaphragm is at least partially located in the through hole, the speaker further comprises a connecting piece connected with an outer surface of the yoke, the connecting piece covers the through hole. Compared with the related art, the speaker disclosed by the present disclosure has better acoustic performance.

5 Claims, 4 Drawing Sheets

SPEAKER

TECHNICAL FIELD

The present disclosure relates to an electro-acoustic device, in particular to a speaker used in portable electronic products.

BACKGROUND

With the advent of the mobile internet era, electronic products are being updated faster and faster, and people have higher and higher requirements for the performance of electronic products, one of them is the high-quality music function. Therefore, the performance of the electro-acoustic system needs to be continuously improved, and high-quality speakers are one of the prerequisites for realizing this high-quality music function.

A related speaker usually includes a frame, and a vibration system and a magnetic circuit system fixed to the frame. The vibration system includes a diaphragm, a voice coil driving the diaphragm to vibrate and emit sounds, and a flexible circuit board fixedly connected with the voice coil. The flexible circuit board comprises a first fixing portion connected with the voice coil, a second fixing portion connected with the frame, and an elastic arm connected with the first fixing portion and the second fixing portion. The magnetic circuit system comprises a yoke fixed to the frame, a projection of the elastic arm along a vibration direction of the diaphragm is located in the yoke. Therefore, during a vibration of the elastic arm, the elastic arm is easy to touch the yoke, which restricts the movement of the elastic arm and affects the performance of the product.

Therefore, it is a need to provide an improved speaker to solve the above problems.

SUMMARY

In view of the above, an objective of the present disclosure is to provide a speaker with better acoustic performance.

In order to achieve the objective mentioned above, the present disclosure discloses a speaker including: a frame, a vibration system fixed to the frame, including a diaphragm fixed to the frame, a voice coil driving the diaphragm to vibrate and emit sounds, and a flexible circuit board fixedly connected with the voice coil, the flexible circuit board including a first fixing portion connected with the voice coil, a second fixing portion connected with the frame, and an elastic arm connected with the first fixing portion and the second fixing portion, and a magnetic circuit system fixed to the frame, comprising a yoke with a through hole and a main magnet and a secondary magnet fixed to the yoke, the secondary magnet surrounding and spaced from the main magnet for forming a magnetic gap, the voice coil located in the magnetic gap, wherein a projection of the elastic arm along a vibration direction of the diaphragm is at least partially located in the through hole, the speaker further comprises a connecting piece connected with an outer surface of the yoke, the connecting piece covers the through hole.

As an improvement, the flexible circuit board is located at a side of the voice coil away from the diaphragm, and the first fixing portion is connected with a lower surface of the voice coil.

As an improvement, the yoke comprises an inner surface near the vibration system and an outer surface opposite the inner surface, the yoke further comprises a groove recessed from the outer surface to the inner surface, the through hole penetrates the groove, and the connecting piece is located in the groove.

As an improvement, the connection piece is steel piece, or polycarbonate piece, or polyester resin piece.

As an improvement, the voice coil is runway-shaped, an amount of the flexible circuit boards is four, the four flexible circuit boards are respectively arranged at four corners of the voice coil, an amount of the through holes is four, the four through holes correspond to the four flexible circuit boards one by one.

As an improvement, an amount of the connecting pieces is four, and the four connecting pieces corresponds to the four through holes one by one.

As an improvement, an amount of the connecting pieces is two, and each connecting piece covers two through holes.

As an improvement, the connecting piece is one piece in a hollow ring structure, which comprises a main portion covering the four through holes and a connecting arm connecting with adjacent the main portion.

As an improvement, the magnetic circuit system further comprises a main pole plate attached to the main magnet and a secondary pole plate attached to the secondary magnet, the secondary pole plate comprises an avoiding portion for accommodating the flexible circuit board.

DESCRIPTION OF EMBODIMENTS

The technical solutions in embodiments of the present disclosure will be described clearly and completely below with reference to the accompanying drawings in the embodiments of the present disclosure.

First Embodiment

Figure 1:
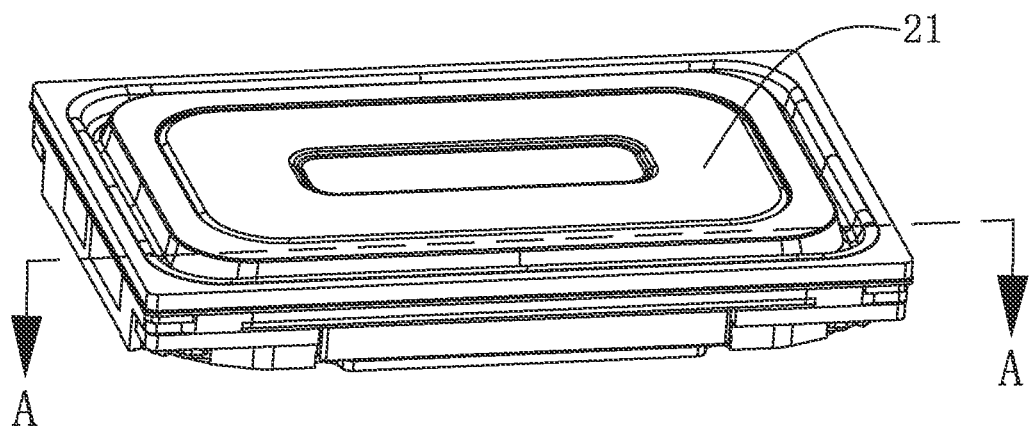
FIG. 1 is an isometric view of a speaker in accordance with a first embodiment of the present disclosure.
Figure 2:
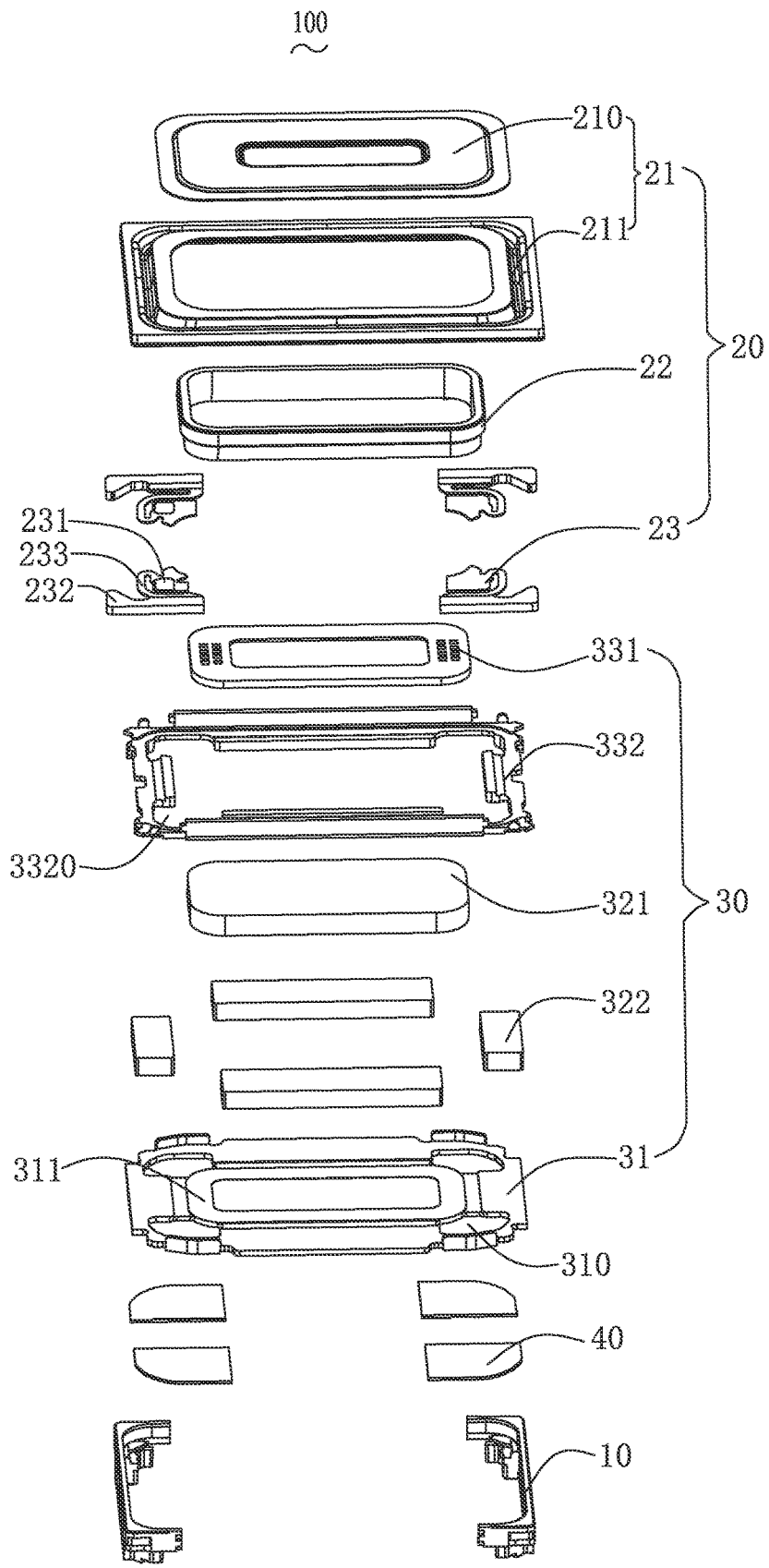
FIG. 2 is an exploded view of the speaker in FIG. 1.
Figure 3:
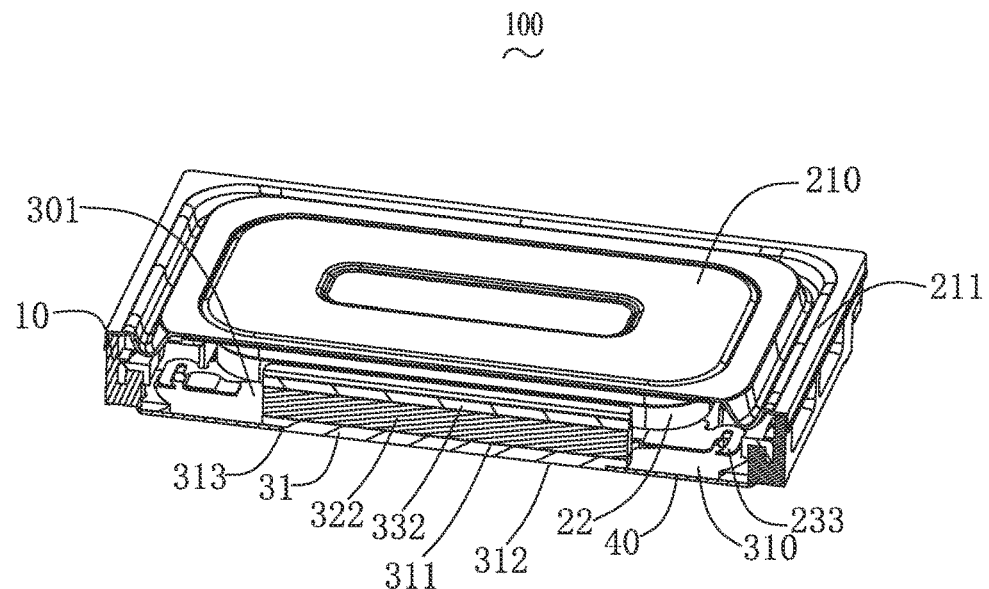
FIG. 3 is a cross-sectional view of the speaker taken along line A-A in FIG. 1.

As shown in FIGS. 1-3, this embodiment provides a speaker 100. The speaker 100 includes a frame 10, and a vibration system 20 and a magnetic circuit system 30 fixed to the frame 10. The vibration system 20 includes a diaphragm 21 fixed to the frame 10, a voice coil 22 driving the diaphragm 21 to vibrate and emit sounds, and a flexible circuit board 23 fixedly connected with the voice coil 22. The magnetic circuit system 30 includes a yoke 31 with a through hole 310, a main magnet 321 and a secondary magnet 322 fixed to the yoke 31, a main pole plate 331 attached to the main magnet 321, and a secondary pole plate 332 attached to the secondary magnet 322. The secondary magnet 322 surrounds and is spaced from the main magnet 321 for forming a magnetic gap 301, the voice coil 22 is runway-shaped and located in the magnetic gap 301.

The flexible circuit board 23 includes a first fixing portion 231 connected with the voice coil 22, a second fixing portion 232 connected with the frame 10, and an elastic arm 233 connected with the first fixing portion 231 and the second fixing portion 232. The flexible circuit board 23 is located in the magnetic gap 301, and the flexible circuit board 23 is located at a side of the voice coil 22 away from the diaphragm 21, the first fixing portion 231 is connected with a lower surface of the voice coil 22, that is, the flexible circuit board 23 fixedly supports the voice coil 22 and is electrically connected with the voice coil 22. Specifically, an amount of the flexible circuit boards 23 is four, the four flexible circuit boards 23 respectively arranged at four corners of the voice coil 22. In addition, the secondary pole plate 332 is provided with an avoiding portion 3320 for accommodating the flexible circuit board 23, and correspondingly, an amount of the avoiding portions 3320 is also four.

A projection of the elastic arm 233 along a vibration direction of the diaphragm 21 is at least partially located in the through hole 310, therefore, the through hole 310 of the yoke 31 could increase a vibration space of the elastic arm 233. Correspondingly, an amount of the through holes 310 is four, the four through holes 310 correspond to the four flexible circuit boards 23 one by one.

In addition, the speaker 100 further includes a connecting piece 40 connected with an outer surface of the yoke 31, the connecting piece 40 covers the through hole 310. The connection piece 40 is steel, or polycarbonate, or polyester resin piece. Thus, the through hole 310 can also ensure air leakage, and the connecting piece 40 can prevent dust from entering. In other embodiments, the connecting piece 40 can also be made of other materials.

Figure 4:
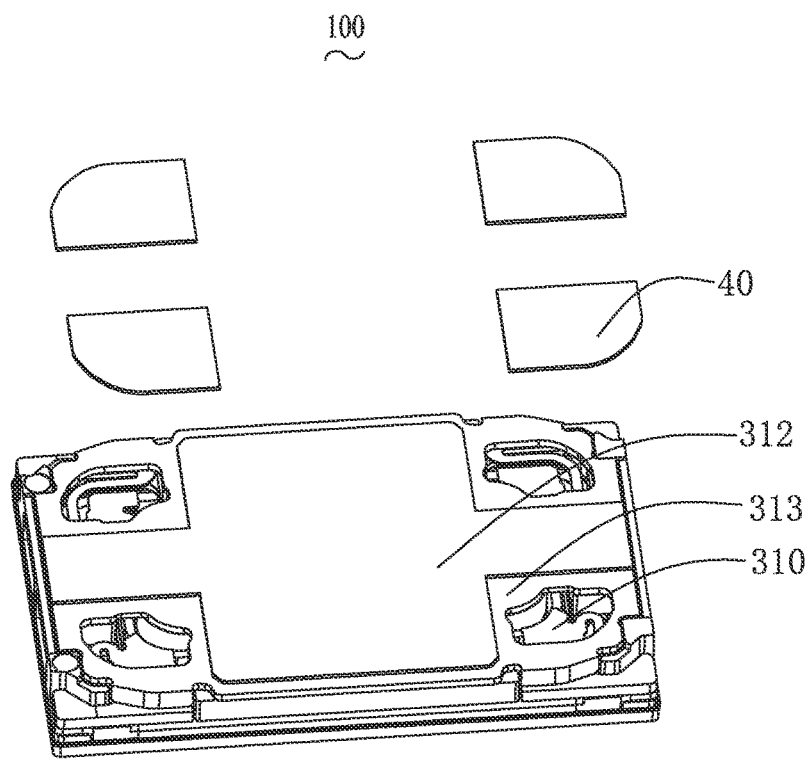
FIG. 4 is an exploded view of a part of the structure of the speaker in accordance with a first embodiment of the present disclosure.

Referring to FIG. 4, the yoke 31 includes an inner surface 311 near the vibration system 20 and an outer surface 312 opposite the inner surface 311, the yoke 31 further includes a groove 313 recessed from the outer surface 312 to the inner surface 311, the through hole 310 penetrates the groove 313, and the connecting piece 40 is located in the groove 313. Therefore, the arrangement of the connecting piece 40 does not increase the overall height of the speaker 100.

In this embodiment, an amount of the connecting pieces 40 is four, and the four connecting pieces 40 correspond to the four through holes 310 one by one.

Second Embodiment

Figure 5:
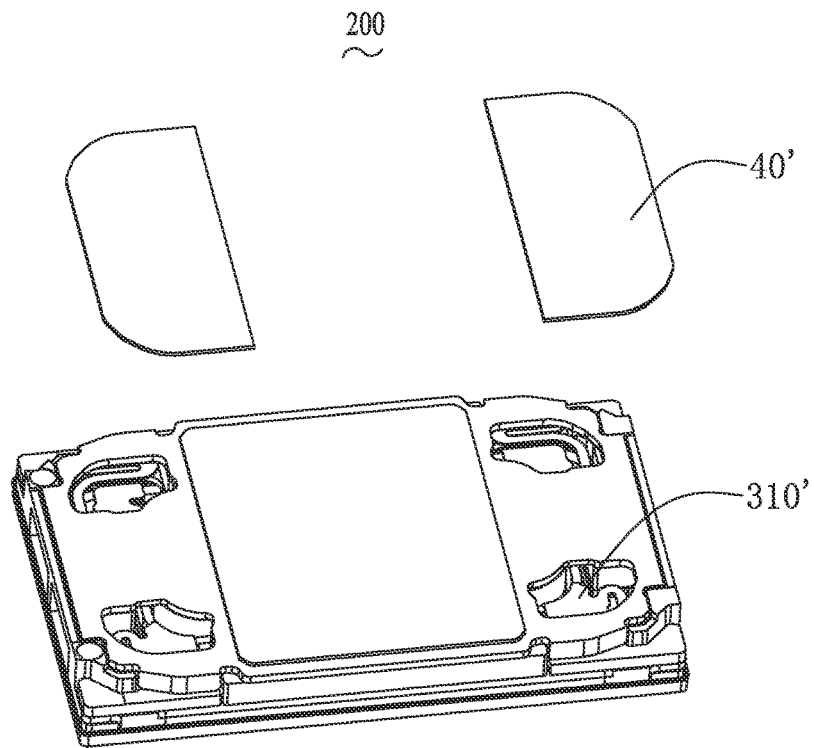
FIG. 5 is an exploded view of a part of the structure of the speaker in accordance with a second embodiment of the present disclosure.

Referring to FIG. 5, a speaker 200 is provided by the second embodiment. The distinction between the second embodiment and the first embodiment is that, an amount of the connecting pieces 40' is two, each connecting piece 40' covers two through holes 310'.

Third Embodiment

Figure 6:
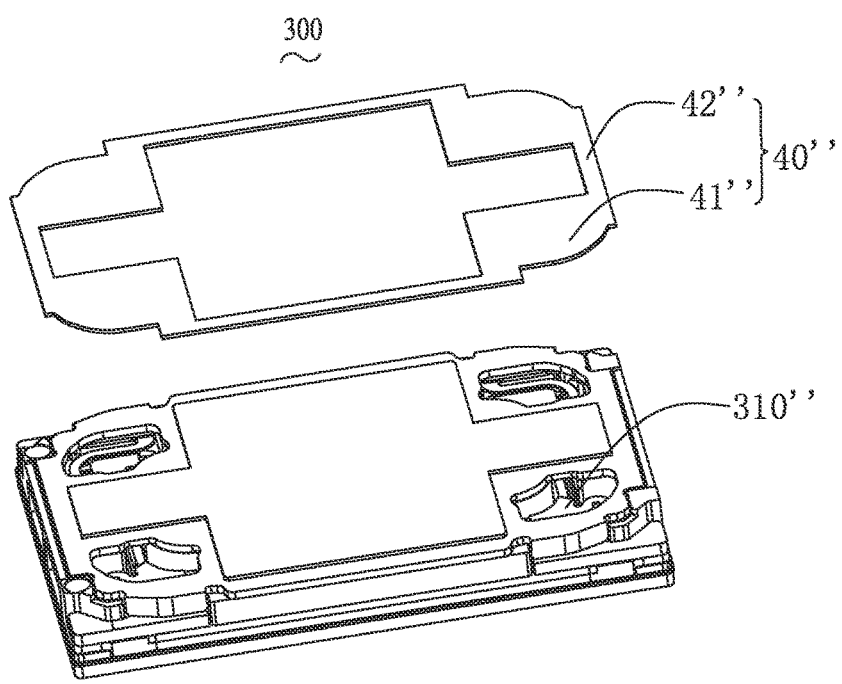
FIG. 6 is an exploded view of a part of the structure of the speaker in accordance with a third embodiment of the present disclosure.

Referring to FIG. 6, a speaker 300 is provided by the third embodiment. The distinction between the third embodiment and the first embodiment is that, the connecting piece 40" is one piece in a hollow ring structure, which includes a main portion 41" covering the four through holes 310" and a connecting arm 42" connecting adjacent the main portion 41".

Compared with the related art, the above-mentioned speaker increases the vibration space of the flexible circuit board and improves the performance of the product by setting the through hole corresponding to the flexible circuit board on the yoke.

The above descriptions are merely some of the embodiments of the present disclosure. It should be pointed out that for those of ordinary skill in the art, improvements can be made without departing from the inventive concept of the present disclosure, shall fall within the scope of the present disclosure.

What is claimed is:

1. A speaker, comprising:
   a frame,
   a vibration system fixed to the frame, comprising a diaphragm fixed to the frame, a voice coil driving the diaphragm to vibrate and emit sounds, and a flexible circuit board fixedly connected with the voice coil, the flexible circuit board comprising a first fixing portion connected with the voice coil, a second fixing portion connected with the frame, and an elastic arm connected with the first fixing portion and the second fixing portion, and
   a magnetic circuit system fixed to the frame, comprising a yoke with a through hole and a main magnet and a secondary magnet fixed to the yoke, the secondary magnet surrounding and spaced from the main magnet for forming a magnetic gap, the voice coil located in the magnetic gap, wherein
   a projection of the elastic arm along a vibration direction of the diaphragm is at least partially located in the through hole, the speaker further comprises a connecting piece connected with an outer surface of the yoke, the connecting piece covers the through hole, the voice coil is runway-shaped, an amount of the flexible circuit boards is four, the four flexible circuit boards are respectively arranged at four corners of the voice coil, an amount of the through holes is four, the four through holes correspond to the four flexible circuit boards one by one, the connecting piece is one piece in a hollow ring structure, which comprises a main portion covering the four through holes and a connecting arm connecting with adjacent the main portion.

2. The speaker described as claim 1, wherein the flexible circuit board is located at a side of the voice coil away from the diaphragm, and the first fixing portion is connected with a lower surface of the voice coil.

3. The speaker described as claim 1, wherein the yoke comprises an inner surface near the vibration system and an outer surface opposite the inner surface, the yoke further comprises a groove recessed from the outer surface to the inner surface, the through hole penetrates the groove, and the connecting piece is located in the groove.

4. The speaker described as claim 1, wherein the connection piece is steel piece, or polycarbonate piece, or polyester resin piece.

5. The speaker described as claim 1, wherein the magnetic circuit system further comprises a main pole plate attached to the main magnet and a secondary pole plate attached to the secondary magnet, the secondary pole plate comprises an avoiding portion for accommodating the flexible circuit board.

* * * * *